(12) United States Patent  
Lemmi et al.

(10) Patent No.: US 7,521,340 B2  
(45) Date of Patent: Apr. 21, 2009

(54) METHODS FOR CREATING A DENSIFIED GROUP IV SEMICONDUCTOR NANOPARTICLE THIN FILM

(75) Inventors: Francesco Lemmi, Sunnyvale, CA (US); Elena V. Rogojina, Los Altos, CA (US); Pingrong Yu, Sunnyvale, CA (US); David Jurbergs, Austin, TX (US); Homer Antoniadis, Mountain View, CA (US); Maxim Kelman, Mountain View, CA (US)

(73) Assignee: Innovalight, Inc., Sunnyvale, CA (US)

( * ) Notice: Subject to any disclaimer, the term of this patent is extended or adjusted under 35 U.S.C. 154(b) by 0 days.

(21) Appl. No.: 11/950,024

(22) Filed: Dec. 4, 2007

(65) Prior Publication Data

US 2008/0146005 A1   Jun. 19, 2008

Related U.S. Application Data

(60) Provisional application No. 60/873,412, filed on Dec. 7, 2006.

(51) Int. Cl.  
*H01L 21/20* (2006.01)

(52) U.S. Cl. ............... 438/479; 136/255; 977/982; 977/893

(58) Field of Classification Search ......... 438/479; 136/255; 977/855, 857, 887, 890, 892, 893  
See application file for complete search history.

(56) References Cited

U.S. PATENT DOCUMENTS 4,262,631 A   4/1981   Kubacki 5,576,248 A   11/1996   Goldstein  
6,878,871 B2*   4/2005   Scher et al. ............... 136/252  
2003/0003300 A1   1/2003   Korgel et al.

(Continued)

FOREIGN PATENT DOCUMENTS

EP   1551057   7/2005

(Continued)

OTHER PUBLICATIONS

Christiansen, T. et al., "Standard Operating Procedure: Spin-on-Glass Surface Level Characterization," Jun. 8, 2000.

(Continued)

*Primary Examiner*—W. David Coleman  
(74) *Attorney, Agent, or Firm*—Foley & Lardner LLP

(57) ABSTRACT

A method of forming a densified nanoparticle thin film in a chamber is disclosed. The method includes positioning a substrate in the chamber; and depositing a nanoparticle ink, the nanoparticle ink including a set of Group IV semiconductor particles and a solvent. The method also includes heating the nanoparticle ink to a first temperature between about 30° C. and about 300° C., and for a first time period between about 1 minute and about 60 minutes, wherein the solvent is substantially removed, and a porous compact is formed. The method further includes exposing the porous compact to an HF vapor for a second time period of between about 2 minutes and about 20 minutes, and heating the porous compact for a second temperature of between about 25° C. and about 60° C.; and heating the porous compact to a third temperature between about 100° C. and about 1000° C., and for a third time period of between about 5 minutes and about 10 hours; wherein the densified nanoparticle thin film is formed.

21 Claims, 7 Drawing Sheets

U.S. PATENT DOCUMENTS

| | | | |
|---|---|---|---|
| 2003/0226498 A1* | 12/2003 | Alivisatos et al. | 117/84 |
| 2004/0126582 A1* | 7/2004 | Ng et al. | 428/403 |
| 2006/0154036 A1 | 7/2006 | Kunze et al. | |
| 2006/0237719 A1 | 10/2006 | Colfer et al. | |

OTHER PUBLICATIONS

Jang, W. I. et al., "Fabrication of MEMS Devices by Using Anhydrous HF Gas-phase Etching with Alcoholic Vapor" *J. Micromech. Microeng.*, vol. 12, 2002, pp. 297-306; published by IOP Publishing Ltd.

Kubacki, R. M., "Low Temperature Plasma Deposition of Silicon Nitride to Produce Ultra-Reliable, High Performance, Low Cost Sealed Chip-on-Board (SCOB) Assemblies" *IEEE Transactions on Components, Packaging, and Manufacturing Technology—Part A*, vol. 18, No. 3, Sep. 1995, pp. 471-477.

Lee, J. H. et al, "Gas-Phase Etching of Sacrificial Oxides Using Anhydrous HF and $CH_3OH$," $10^{th}$ Annual Internat'l Workshop on MEMS, IEEE, Jan. 26-30, 1997, pp. 448-453.

Orfert, M. et al., "Plasma Enhanced Chemical Vapor Deposition of SiN-films For Passivation of Three-Dimensional Substrates" *Surface and Coatings Technology 116-119*, 1999, pp. 622-628; published by Elsevier Science S.A.

Schmid, P. et al, "Plasma deposition of Si-N and Si-O passivation layers on three-dimensional sensor devices" *Surface and Coating Technology 98*, 1998, pp. 1510-1517; published by Elsevier Science S.A.

International Search Report for PCT/US2007/086376 dated May 28, 2008.

International Search Report for PCT/US2007/086432 dated May 28, 2008.

* cited by examiner

100

> Produce Group IV nanoparticles of desired material and size in inert environment — 110

> Transfer Group IV nanoparticles into an inert environment and prepare dispersion (ink) in inert solvent — 120

> Deposit Group IV porous compact from ink in an inert environment — 130

> Fabricate Group IV thin film from porous compact in an inert environment with *in situ* treatment — 140

> Transfer thin film from inert environment after fabrication — 150

FIG.1

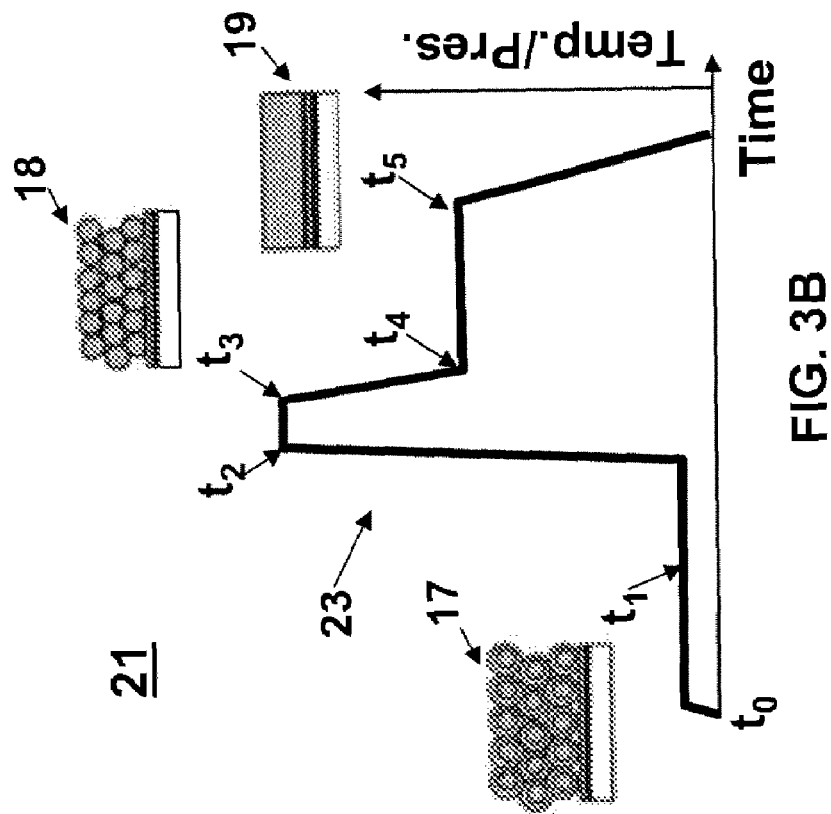
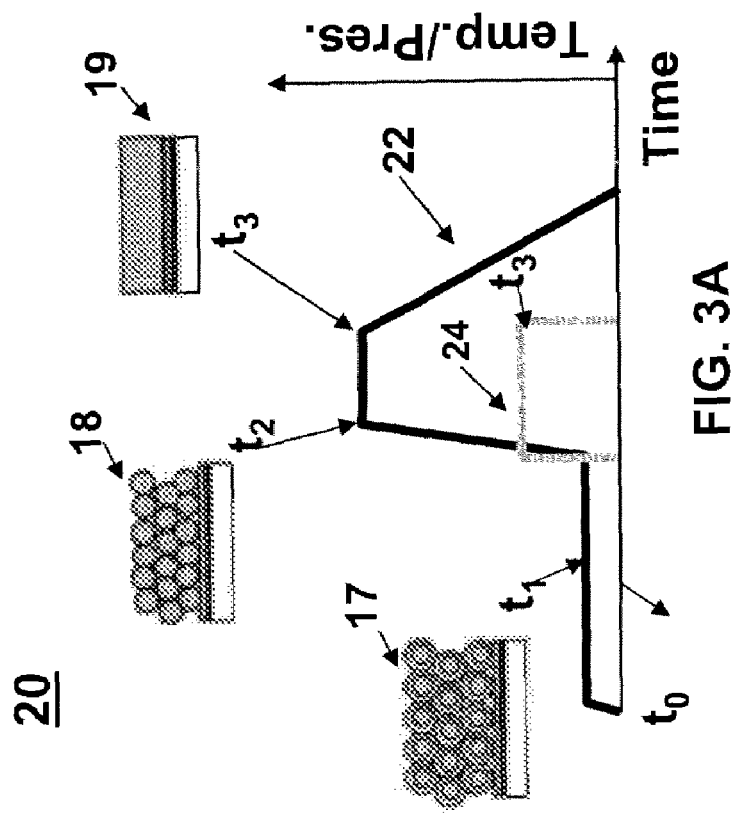
FIG. 3A
FIG. 3B

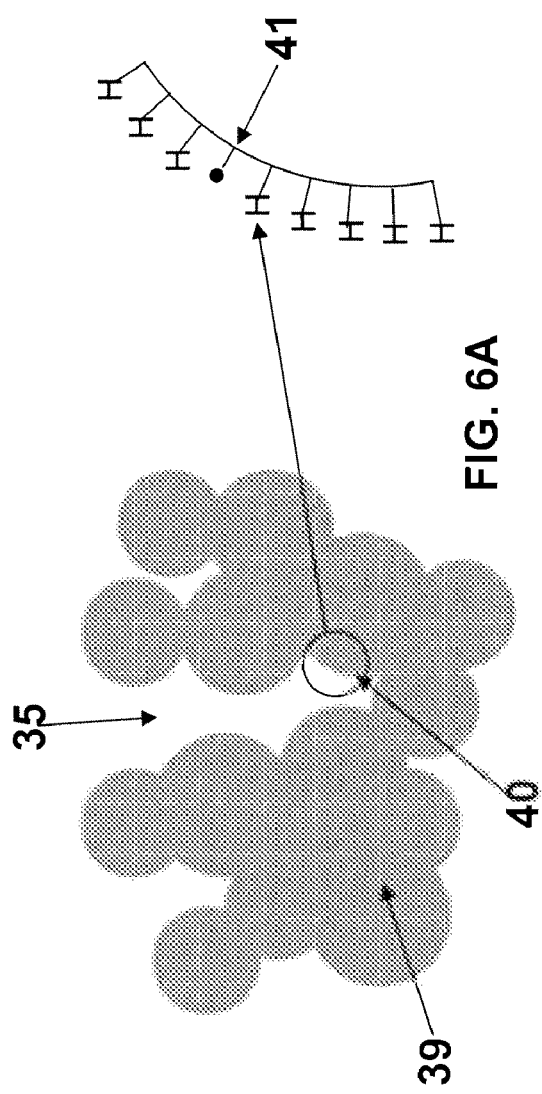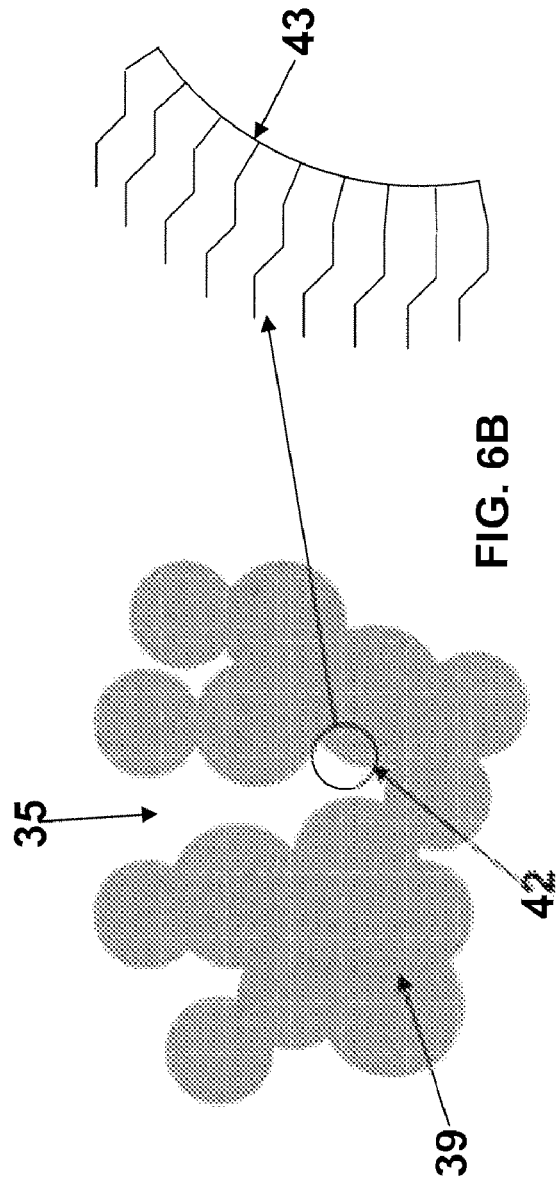
FIG. 6A
FIG. 6B

US 7,521,340 B2

METHODS FOR CREATING A DENSIFIED GROUP IV SEMICONDUCTOR NANOPARTICLE THIN FILM

CROSS-REFERENCE TO RELATED APPLICATIONS

This application claims the benefit of U.S. Provisional Patent Application Ser. No. 60/873,412 filed Dec. 7, 2006, the entire disclosure of which is incorporated by reference.

FIELD

This disclosure relates in general to Group IV semiconductor thin films, and in particular to methods for creating a densified Group IV semiconductor nanoparticle thin film.

BACKGROUND

The Group IV semiconductor materials enjoy wide acceptance as the materials of choice in a range of devices in numerous markets such as communications, computation, and energy. Currently, particular interest is aimed in the art at improvements in devices utilizing semiconductor thin film technologies due to the widely recognized disadvantages of chemical vapor deposition (CVD) technologies. For example, some of the drawbacks of the current CVD technologies in the fabrication of semiconductor thin films and devices include the slow deposition rates, which limit the cost-effective fabrication of a range of film thicknesses, the difficulty in accommodating large components, high processing temperatures, and the high production of chemical wastes.

In that regard, with the emergence of nanotechnology, there is in general growing interest in leveraging the advantages of these new materials in order to produce low-cost devices with designed functionality using high volume manufacturing on nontraditional substrates. It is therefore desirable to leverage the knowledge of Group IV semiconductor materials and at the same time exploit the advantages of Group IV semiconductor nanoparticles for producing novel thin films which may be readily integrated into a number of devices. Particularly, Group IV nanoparticles in the range of between about 1.0 nm to about 100.0 nm may exhibit a number of unique electronic, magnetic, catalytic, physical, optoelectronic, and optical properties due to quantum confinement and surface energy effects.

With respect to thin films compositions utilizing nanoparticles, U.S. Pat. No. 6,878,871 describes photovoltaic devices having thin layer structures that include inorganic nanostructures, optionally dispersed in a conductive polymer binder. Similarly, U.S. Patent Application Publication No. 2003/0226498 describes semiconductor nanocrystal/conjugated polymer thin films, and U.S. Patent Application Publication No. 2004/0126582 describes materials comprising semiconductor particles embedded in an inorganic or organic matrix. Notably, these references focus on the use of Group II-VI or III-V nanostructures in thin layer structures, rather than thin films formed from Group IV nanostructures.

An account of nanocrystalline silicon particles of about 30 nm in diameter, and formulated in a solvent-binder carrier is given in International Patent Application No. WO2004IB00221. The nanoparticles were mixed with organic binders such as polystyrene in solvents such as chloroform to produce semiconductor inks that were printed on bond paper without further processing. In U.S. Patent Application Publication No. 2006/0154036, composite sintered thin films of Group IV nanoparticles and hydrogenated amorphous Group IV materials are discussed. The Group IV nanoparticles are in the range 0.1 to 10 nm, in which the nanoparticles were passivated, typically using an organic passivation layer. In order to fabricate thin films from these passivated particles, the processing was performed at 400° C., where nanoparticles below 10 nm are used to lower the processing temperature. In both examples, significant amounts of organic materials are present in the Group IV thin film layers, and the composites formed are substantially different than the well-accepted native Group IV semiconductor thin films.

U.S. Pat. No. 5,576,248 describes Group IV semiconductor thin films formed from nanocrystalline silicon and germanium of 1 nm to 100 nm in diameter, where the film thickness is not more than three to four particles deep, yielding film thickness of about 2.5 nm to about 20 nm. For many electronic and photoelectronic applications, Group IV semiconductor thin films of about 200 nm to 3 microns are desirable.

Therefore, there is a need in the art for native Group IV semiconductor thin films of about 200 nm to 3 microns in thickness fabricated from Group IV semiconductor nanoparticles, which thin films are readily made using high volume processing methods.

SUMMARY

The invention relates, in one embodiment, to a method of forming a densified nanoparticle thin film in a chamber. The method includes positioning a substrate in the chamber; and depositing a nanoparticle ink, the nanoparticle ink including a set of Group IV semiconductor particles and a solvent. The method also includes heating the nanoparticle ink to a first temperature between about 30° C. and about 300° C., and for a first time period between about 1 minute and about 60 minutes, wherein the solvent is substantially removed, and a porous compact is formed. The method further includes exposing the porous compact to an HF vapor for a second time period of between about 2 minutes and about 20 minutes, and heating the porous compact for a second temperature of between about 25° C. and about 60° C.; and heating the porous compact to a third temperature between about 100° C. and about 1000° C., and for a third time period of between about 5 minutes and about 10 hours; wherein the densified nanoparticle thin film is formed.

BRIEF DESCRIPTION OF THE DRAWINGS

FIG. 1 is a flow chart that depicts processing steps for the formation of embodiments of Group IV semiconductor thin films using in situ treatment of a thin film during fabrication, in accordance with the invention;

FIG. 3A and FIG. 3B show two embodiments of in situ processes for removing an oxide coating from Group IV semiconductor nanoparticles, in accordance with the invention;

FIG. 6A and FIG. 6B depict a section of a Group IV nanoparticle thin film before surface passivation (FIG. 6A) and after surface passivation (FIG. 6B), in accordance with the invention; and, FIG. 7 shows an embodiment of an in situ process for surface passivation of a Group IV semiconductor thin film.

DETAILED DESCRIPTION

Figure 2B:
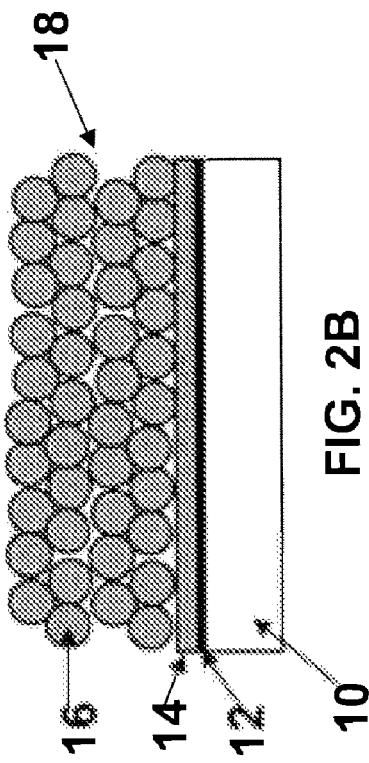
FIGS. 2A-2C depict the process of thin film formation from oxide coated Group IV semiconductor nanoparticles using in situ processing during thin film fabrication, in accordance with the invention.

Embodiments of thin films formed from native Group IV semiconductor nanoparticles, and methods for making such thin films are disclosed herein. The photoconductive thin films result from coating substrates using dispersions of Group IV nanoparticles to form a porous compact, which porous compact is processed to form a Group IV semiconductor thin film. Either during the fabrication of a Group IV semiconductor thin film from the porous compact, or subsequent to the fabrication of a Group IV semiconductor thin film, in situ treatment may be done. The fabrication process, as well as the in situ treatment is done in an inert environment. The in situ processing is done to ensure the long-term stability and function of the fabricated Group IV semiconductor thin films. In some embodiments, in situ treatment is done to remove non-Group IV semiconductor material from the nanoparticle or thin film surfaces during thin film fabrication. In other embodiments, fluids are used during or subsequent to thin film fabrication in an inert environment to fill or essentially fill the interstitial spaces in a thin film with insulating material. Finally in other embodiments, in situ passivation of surfaces that are in fluid communication with the external environment may be done.

The embodiments of the disclosed thin films fabricated from Group IV semiconductor nanoparticle starting materials evolved from the inventors' observations that by keeping embodiments of the native Group IV semiconductor nanoparticles in an inert environment from the moment the particles are formed through the formation of Group IV semiconductor thin films, that such thin films so produced have properties characteristic of native bulk semiconductor materials. In that regard, such thin films are formed from materials for which the electrical, spectral absorbance and photoconductive properties are well characterized. This is in contrast, for example, to the use of modified Group IV semiconductor nanoparticles, which modifications generally use organic species to stabilize the reactive particles, or mix the nanoparticles with organic modifiers, or both. In some such modifications, the Group IV nanoparticle materials are significantly oxidized. The use of these types of nanoparticle materials produces hybrid thin films, which hybrid thin films do not have as yet the same desirable properties as traditional Group IV semiconductor materials.

As used herein, the term "Group IV semiconductor nanoparticle" generally refers to hydrogen terminated Group IV semiconductor nanoparticles having an average diameter between about 1.0 nm to 100.0 nm, and composed of silicon, germanium, and alpha-tin, or combinations thereof. As will be discussed subsequently, some embodiments of thin film devices utilize doped Group IV semiconductor nanoparticles. With respect to shape, embodiments of Group IV semiconductor nanoparticles include elongated particle shapes, such as nanowires, or irregular shapes, in addition to more regular shapes, such as spherical, hexagonal, and cubic nanoparticles, and mixtures thereof. Additionally, the nanoparticles may be single-crystalline, polycrystalline, or amorphous in nature. As such, a variety of types of Group IV semiconductor nanoparticle materials may be created by varying the attributes of composition, size, shape, and crystallinity of Group IV semiconductor nanoparticles. Exemplary types of Group IV semiconductor nanoparticle materials are yielded by variations including, but not limited by: 1.) single or mixed elemental composition; including alloys, core/shell structures, doped nanoparticles, and combinations thereof 2.) single or mixed shapes and sizes, and combinations thereof, and 3.) single form of crystallinity or a range or mixture of crystallinity, and combinations thereof.

Group IV semiconductor nanoparticles have an intermediate size between individual atoms and macroscopic bulk solids. In some embodiments, Group IV semiconductor nanoparticles have a size on the order of the Bohr exciton radius (e.g. 4.9 nm), or the de Broglie wavelength, which allows individual Group IV semiconductor nanoparticles to trap individual or discrete numbers of charge carriers, either electrons or holes, or excitons, within the particle. The Group IV semiconductor nanoparticles may exhibit a number of unique electronic, magnetic, catalytic, physical, optoelectronic and optical properties due to quantum confinement and surface energy effects. For example, Group IV semiconductor nanoparticles exhibit luminescence effects that are significantly greater than, as well as melting temperatures of nanoparticles substantially lower than the complementary bulk Group IV materials. These unique effects vary with properties such as size and elemental composition of the nanoparticles. For instance, as will be discussed in more detail subsequently, the melting of germanium nanoparticles is significantly lower than the melting of silicon nanoparticles of comparable size. With respect to quantum confinement effects, for silicon nanoparticles, the range of nanoparticle dimensions for quantum confined behavior is between about 1 nm to about 15 nm, while for germanium nanoparticles, the range of nanoparticle dimensions for quantum confined behavior is between about 1 nm to about 35 nm, and for alpha-tin nanoparticles, the range of nanoparticle dimensions for quantum confined behavior is between about 1 nm to about 40 nm.

Regarding the terminology of the art for Group IV semiconductor thin film materials, the term "amorphous" is generally defined as non-crystalline material lacking long-range periodic ordering, while the term "polycrystalline" is generally defined as a material composed of crystallite grains of different crystallographic orientation, where the amorphous state is either absent or minimized (e.g. within the grain boundary and having an atomic monolayer in thickness). With respect to the term "microcrystalline", in some current definitions, this represents a thin film having properties between that of amorphous and polycrystalline, where the crystal volume fraction may range between a few percent to about 90%. In that regard, on the upper end of such a definition, there is arguably a continuum between that which is microcrystalline and polycrystalline. For the purpose of what is described herein, "microcrystalline" is a thin film in which microcrystallites are embedded in an amorphous matrix, and "polycrystalline" is not constrained by crystallite size, but rather a thin film having properties reflective of the highly crystalline nature.

With respect to process step 110 of FIG. 1, the Group IV semiconductor nanoparticles may be made according to any suitable method, several of which are known, provided they are initially formed in an environment that is substantially inert, and substantially oxygen-free. As used herein, "inert" is not limited to only substantially oxygen-free. It is recognized that other fluids (i.e. gases, solvents, and solutions) may react in such a way that they negatively affect the electrical and photoconductive properties of Group IV semiconductor nanoparticles. Additionally, the terms "substantially oxygen-free" in reference to environments, solvents, or solutions refer to environments, solvents, or solutions wherein the oxygen content has been substantially reduced to produce Group IV semiconductor thin films having no more than $10^{17}$ to $10^{19}$ oxygen per cubic centimeter of Group IV semiconductor thin film. For example, it is contemplated that plasma phase preparation of hydrogen-terminated Group IV semiconductor nanoparticles is done in an inert, substantially oxygen-free environment. As such, plasma phase methods produce nanoparticle materials of the quality suitable for making embodiments of Group IV semiconductor thin film devices. For example, one plasma phase method, in which the particles are formed in an inert, substantially oxygen-free environment, is disclosed in U.S. patent application Ser. No. 11/155,340, filed Jun. 17, 2005; the entirety of which is incorporated herein by reference.

In reference to step 120 of process flow chart 100 shown in FIG. 1, once the preparation of quality Group IV semiconductor nanoparticles having a desired size and size distribution have been formed in an inert, substantially oxygen-free environment, they are transferred to an inert, substantially oxygen-free dispersion solvent or solution for the preparation of embodiments dispersions and suspensions of the nanoparticles; or preparation of an ink. The transfer may take place under vacuum or under an inert, substantially oxygen-free environment. In terms of preparation of the dispersions, the use of particle dispersal methods such as sonication, high shear mixers, and high pressure/high shear homogenizers are contemplated for use to facilitate dispersion of the particles in a selected solvent or mixture of solvents. For example, inert dispersion solvents contemplated for use include, but are not limited to chloroform, tetrachloroethane, chlorobenzene, xylenes, mesitylene, diethylbenzene, 1,3,5 triethylbenzene (1,3,5 TEB), and silanes, and combinations thereof.

Various embodiments of Group IV semiconductor nanoparticle inks can be formulated by the selective blending of different types of Group IV semiconductor nanoparticles. For example, varying the packing density of Group IV semiconductor nanoparticles in a deposited thin layer is desirable for forming a variety of embodiments of Group IV photoconductive thin films. In that regard, Group IV semiconductor nanoparticle inks can be prepared in which various sizes of monodispersed Group IV semiconductor nanoparticles are specifically blended to a controlled level of polydispersity for a targeted nanoparticle packing. Further, Group IV semiconductor nanoparticle inks can be prepared in which various sizes, as well as shapes are blended in a controlled fashion to control the packing density.

Additionally, particle size and composition may impact fabrication processes, so that various embodiments of inks may be formulated that are specifically tailored to thin film fabrication. This is due to that fact that there is a direct correlation between nanoparticle size and melting temperature. For example, for silicon nanoparticles between the size range of about 1 nm to about 15 nm, the melting temperature is in the range of between about 400° C. to about 800° C. versus the melting of bulk silicon, which is 1420° C. For germanium, nanoparticles of in a comparable size range of about 1 nm to about 15 nm melt at a lower temperature of between about 100° C. to about 400° C., which is also significantly lower than the melting of bulk germanium at about 935° C. Therefore, the melting temperatures of the Group IV nanoparticle materials as a function of size and composition may be exploited in embodiments of ink formulations for targeting the fabrication temperature of a Group IV semiconductor thin film.

Another example of what may be achieved through the selective formulation of Group IV semiconductor nanoparticle inks by blending doped and undoped Group IV semiconductor nanoparticles. For example, various embodiments of Group IV semiconductor nanoparticle inks can be prepared in which the dopant level for a specific thin layer of a targeted device design is formulated by blending doped and undoped Group IV semiconductor nanoparticles to achieve the requirements for that layer. In still another example are embodiments of Group IV semiconductor nanoparticle inks that may compensate for defects in embodiments of Group IV photoconductive thin films. For example, it is known that in an intrinsic silicon thin film, oxygen may act to create undesirable energy states. To compensate for this, low levels of p-type dopants, such as boron difluoride, trimethyl borane, or diborane, may be used to compensate for the presence of low levels of oxygen. By using Group IV semiconductor nanoparticles to formulate embodiments of inks, such low levels of p-type dopants may be readily introduced in embodiments of blends of the appropriate amount of p-doped Group IV semiconductor nanoparticles with various types of undoped Group IV semiconductor nanoparticles.

Other embodiments of Group IV semiconductor nanoparticle inks can be formulated that adjust the band gap of embodiments of Group IV photoconductive thin films. For example, the band gap of silicon is about 1.1 eV, while the band gap of germanium is about 0.7 eV, and for alpha-tin is about 0.05 eV. Therefore, formulations of Group IV semiconductor nanoparticle inks may be selectively formulated so that embodiments of Group IV photoconductive thin films may have photon adsorption across a wider range of the electromagnetic spectrum. This may be done through formulations of single or mixed elemental composition of silicon; germanium and tin nanoparticles, including alloys, core/shell structures, doped nanoparticles, and combinations thereof. Embodiments of such formulations of may also leverage the use of single or mixed shapes and sizes, and combinations thereof, as well as a single form of crystallinity or a range or mixture of crystallinity, and combinations thereof.

Still other embodiments of inks can be formulated from alloys and core/shell Group IV semiconductor nanoparticles. For example, it is contemplated that silicon carbide semiconductor nanoparticles are useful for in the formation of a variety of semiconductor thin films and semiconductor devices. In other embodiments, alloys of silicon and germanium are contemplated. Such alloys may be made as discrete alloy nanoparticles, or may be made as core/shell nanoparticles.

After the formulation of an ink, the steps of depositing a thin film of Group IV semiconductor nanoparticles 130, and fabricating the film into Group IV semiconductor thin film using in situ processing 140 are done. In step 130 of FIG. 1, using an embodiment of an ink formulation, a thin film of Group IV semiconductor nanoparticles is deposited on a solid support, which thin film is referred to as a green film or porous compact. It is contemplated that a variety of deposition techniques are suitable for the deposition of the dispersion of Group IV nanoparticles on a substrate. For example, but not limited by, various embodiments of ink formulations may be suitable for use with roll coating, slot die coating, gravure printing, flexographic drum printing, and ink jet printing methods, or combinations thereof.

In one aspect of in situ processing, embodiments of Group IV semiconductor nanoparticles are coated with an oxide layer. Such a coating may be useful for dispersion of the nanoparticles in selected solvents, as well as for promoting stability during storage either as bulk solid or in ink formulations. In order to fabricate Group IV semiconductor thin films from such coated Group IV nanoparticle ink dispersions, the coating is removed using in situ processing during thin film fabrication. For example, a rendering of the processing of coated Group IV semiconductor nanoparticles is schematically depicted in cross-sections thin films in FIGS. 2A-2C, which are renderings for the purpose of highlighting concepts, and are not meant as actual representations of the thin film morphologies of embodiments of Group IV semiconductor thin films disclosed herein.

Figure 2A:
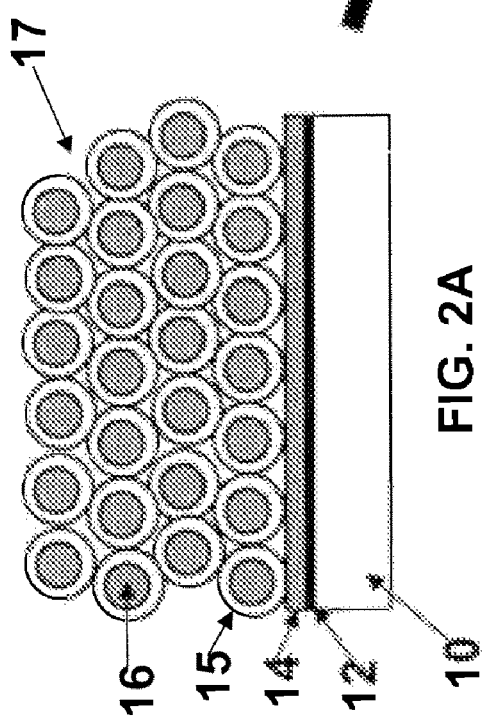
Figure 2C:
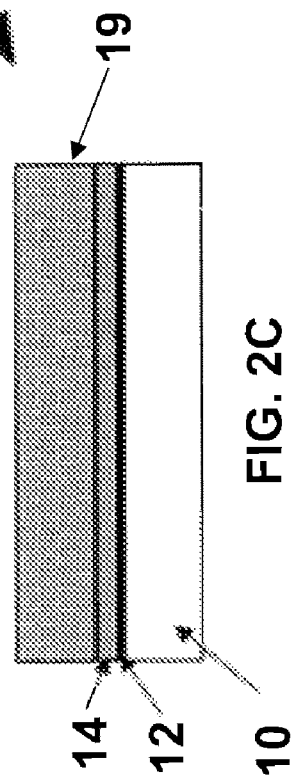

In FIG. 2A, a porous compact 17 deposited using Group IV semiconductor nanoparticles and having a coating layer 15 around nanoparticles 16 is shown. During the processing of embodiments of porous compact 17 to thin film 19, in situ processing may be done to remove the coating 15, allowing a porous compact 18 of Group IV nanoparticles to be formed, as shown in FIG. 2B. In FIG. 2C, a Group IV semiconductor thin film 19 having known properties is formed from the Group IV semiconductor porous compact 18.

In FIGS. 2A-2C, a substrate 10, upon which a first electrode, 14, and optionally an insulating layer 12 between the substrate 10 and electrode 14 are deposited is shown. For the fabrication of some embodiments of a thin film 19, substrate materials may be selected from silicon dioxide-based substrates. Such silicon dioxide-based substrates include, but are not limited by, quartz, and glasses, such as soda lime and borosilicate glasses. Silicon substrates are also considered as substrates for the formation of a thin film 19, where a range of silicon substrates, such as prime grade to metallurgical grade are useful for fabricating a variety of embodiments of thin film 19. For the fabrication of other embodiments of a thin film 19, flexible stainless steel sheet is the substrate of choice, while for the fabrication of still other embodiments of thin film 19, the substrate may be selected from heat-durable polymers, such as polyimides and aromatic fluorene-containing polyarylates, which are examples of polymers having glass transition temperatures above about 300° C. The first electrode 14 is selected from conductive materials, such as, for example, aluminum, molybdenum, chromium, titanium, nickel, and platinum. For various embodiments of photoconductive devices contemplated, the first electrode 14 is between about 10 nm to about 1000 nm in thickness. Optionally, an insulating layer 12 may be deposited on the substrate 10 before the first electrode 14 is deposited. Such an optional layer is useful when the substrate is a dielectric substrate, since it protects the subsequently fabricated Group IV semiconductor thin films from contaminants that may diffuse from the substrate into the Group IV semiconductor thin film during fabrication. When using a conductive substrate, the insulating layer 12 not only protects Group IV semiconductor thin films from contaminants that may diffuse from the substrate, but is required to prevent shorting. Additionally, an insulating layer 12 may be used to planarize an uneven surface of a substrate. Finally, the insulating layer may be thermally insulating to protect the substrate from stress during some types of processing, for example, when using lasers. The insulating layer 12 is selected from dielectric materials such as, for example, but not limited by, silicon nitride, alumina, and silicon oxides. Additionally, layer 12 may act as a diffusion barrier to prevent the accidental doping of the active layers. For various embodiments of photoconductive devices contemplated the insulating layer 12 is about 50 nm to about 100 nm in thickness.

In the absence of in situ processing, the step of fabrication of embodiments of Group IV semiconductor thin film 19 in FIG. 2C from embodiments of Group IV semiconductor nanoparticle compact 18 in FIG. 2B is done in an inert, substantially oxygen free environment, using temperatures between about 100° C. to about 1000° C., depending on the nature of the Group IV semiconductor nanoparticle, and fabrication process parameters, as will be discussed in more detail subsequently. Thin films may be processed in inert environments using a noble gas or nitrogen, or mixtures thereof, or they may be processed in vacuo. Additionally, to create a reducing atmosphere, up to 20% by volume of hydrogen may be mixed with the noble gas, or nitrogen, or mixtures thereof. Though as previously discussed, "inert" is not limited in meaning to substantially oxygen free, one metric of an inert environment includes reducing the oxygen content so that the Group IV semiconductor thin films produced have no more than about $10^{17}$ to $10^{19}$ oxygen content per cubic centimeter of Group IV semiconductor thin film. Heat sources contemplated for use include conventional contact thermal sources, such as resistive heaters, as well as radiative heat sources. Such radiative sources include, for example lamps, lasers, microwave processing equipment, and plasmas. More specifically, tungsten-halogen and continuous arc lamps are exemplary of radiative lamp sources. Additionally, lasers operating in the wavelength range between about 0.3 micron to about 10 micron, and microwave processing equipment operating in even longer wavelength ranges are matched to the fabrication requirements of embodiments of Group IV semiconductor thin films described herein. These types of apparatuses have the wavelengths for the effective penetration of the targeted film thicknesses, as well as the power requirements for fabrication of embodiments of Group IV semiconductor thin films disclosed herein.

With respect to factors affecting the fabrication of a deposited Group IV nanoparticle thin film into a densified thin film, the time required varies as an inverse function in relation to the fabrication temperature. For example, if the fabrication temperature is about 800° C., then for various embodiments of Group IV photoconductive thin films, the fabrication time may be, for example, between about 5 minutes to about 15 minutes. However, if the fabrication temperature is about 400° C., then for various embodiments of Group IV photoconductive thin films, the fabrication temperature may be between about, for example, 1 hour to about 10 hours. The fabrication process may also optionally include the use of pressure of up to about 7000 psig. The fabrication of Group IV semiconductor thin films from Group IV semiconductor nanoparticle materials has been described in U.S. Provisional Application; App. Ser. No. 60/842,818, with a filing date of Sep. 7, 2006, and entitled, "Semiconductor Thin Films Formed from Group IV Nanoparticles". The entirety of this application is incorporated by reference.

Regarding the coating 15 of FIG. 2A, one coating contemplated for use, and removed using in situ processing during Group IV semiconductor thin film fabrication from Group IV semiconductor nanoparticles, is an oxide layer. As previously discussed, Group IV semiconductor nanoparticles are highly reactive, and react with a number of species, such as oxygen and water, to promote the formation of an oxide layer. It has been observed that even under conditions considered inert for one of ordinary skill in the art accustomed to the handling air-sensitive materials that a thin oxide layer may nonetheless form on the Group IV semiconductor nanoparticles. This may be obviated by using more scrupulous conditions for excluding and scrubbing sources of oxygen in order to ensure that there is no more than about $10^{17}$ to about $10^{19}$ of oxygen per cubic centimeter of a Group IV semiconductor thin film, as previously discussed.

Alternatively, under inert conditions, a thin film of a silicon oxide film may be allowed to form as a coating over Group IV semiconductor nanoparticles by controlling the concentration and time of exposure to an oxygen source. Such a thin film may not only provide stability for the Group IV semiconductor nanoparticles, but may allow dispersion of such particles in selected types of solvents, for example including organic solvent classes such as aromatic and aliphatic alcohols, ketones, aldehydes, and ethers, and mixtures thereof.

In FIG. 3A and FIG. 3B, two examples of embodiments of in situ processes useful in the removal of an oxide layer from Group IV semiconductor nanoparticles and thin films are shown which are exemplary renderings solely the purpose of highlighting concepts of embodiments of in situ processes for oxide layer removal from such materials, as previously discussed. In the embodiment of an in situ treatment shown in FIG. 3A, process 20 is an in situ chemical vapor etching process to remove the oxide coat during the fabrication of a Group IV semiconductor thin film. In another embodiment of an in situ process 21 depicted in FIG. 3B, a short exposure to a high-temperature in vacuo of the porous compact formed from oxide capped Group IV semiconductor nanoparticles is used to remove the oxide layer.

Regarding in situ process 20, one embodiment of a process for the in situ removal of an oxide layer formed on Group IV semiconductor nanoparticles, as shown for porous compact 17 of FIG. 3A, is the use of hydrofluoric acid (HF) chemical vapor etching. In addition to the removal of the oxide layer, the HF treatment leaves the surface of the Group IV semiconductor nanoparticles or thin films hydrogen-terminated, which as one of ordinary skill in the art is apprised, is desirable for stability and performance. Regarding the fabrication time and temperature, an embodiment of a time/temperature profile 22 for fabrication process 20 is shown if FIG. 3A. During process phase that includes time $t_1$, a conditioning step is performed. Such a conditioning step may be useful for driving off volatile chemical species, such as solvent, as well as assisting in making the porous compact 17 more mechanically stable. Such a step may be done for about 1 minute to about one hour, and between the temperatures of about 30° C. to about 300° C. in an inert environment, for example, either in the presence of an inert gas, or in vacuo. After the conditioning step at $t_1$, the temperature is ramped to the targeted fabrication temperature $t_2$ for the thermal processing of Group IV semiconductor nanoparticle porous compact 18 to Group IV semiconductor thin film 19, and held for the interval between $t_2$-$t_3$. As previously discussed, the processing temperature for the fabrication of a Group IV semiconductor thin film from Group IV semiconductor nanoparticles may be between about 100° C. to about 1000° C.; the selection of which is take in consideration of fabrication time.

Several embodiments of HF treatment for the in situ removal of an oxide layer on Group IV semiconductor nanoparticles, as shown in FIG. 3A, are contemplated. HF process profile 24 indicates an embodiment of a process profile for the in situ treatment of the device to HF. The HF treatment may be done by exposure of a Group IV semiconductor porous compact to vapors from an aqueous solution of HF or may be done in the vapor phase using anhydrous HF (AHF) in conjunction with mixtures of other vapors. For example, in FIG. 3A, just at the end of the conditioning step, and before reaching the targeted fabrication temperature, at a time $t_2$, the porous compact 19 made of particles having an oxide layer could be exposed to vapors from an aqueous solution saturated with HF. Such solutions are about 49% (w/w) HF. For example, in reference to FIG. 2A, a 1"×1" quartz substrate 10, coated with molybdenum layer 14 of about 100 nm, having a porous compact 19 of about 1 micron in thickness of Group IV semiconductor nanoparticles may be placed in a small chamber. The chamber may be either a material having a fluorohydrocarbon coating, or of a ceramic material, with a volume of between about 50 cc to about 500 cc, in which vapors from a solution of 49% (w/w) HF in water have been allowed to equilibrate. Exposure of such a sample to the aqueous HF vapors may be between about 2 minutes to about 20 minutes at chamber temperatures of between about 25° C. to about 60° C.

Alternatively, anhydrous HF (AHF) vapor with a controlled amount of vapor from a low molecular weight protic solvent, such as water or a low molecular weight alcohol, such as methanol or ethanol, is allowed to flow into the fabrication chamber. The composition of such vapors can vary widely, where the vapor pressure of AHF may be between about 1 Torr to about to 20 Torr, while the ratio of partial pressure of the vapors from the protic solvent to that of AHF may be range between about 0.02 to about 0.7 Generally, the higher the amount of AHF vapor to that of the protic solvent (i.e the lower the ratio of protic solvent vapor to AHF vapor), the faster the etch rate. Additionally, etch rate is impacted by the temperature at which the vapor etching is done. Given the reactivity of AHF, vapor etching temperatures may be done at between about 25° C. to about 60° C. For embodiments of either the exposure of a Group IV semiconductor thin film to vapors from an aqueous HF solution, or using controlled vapor etching, the conditions for etching can be optimized by observing the change in contact angle going from a high surface energy oxide to a low surface energy semiconductor material.

With respect to embodiments of the HF process profile 24, as indicated for an exemplary embodiment of thin film fabrication method 20, the time for introducing the HF may be done at a temperature below the targeted thermal processing temperature. In alternative embodiments of thin film fabrication method 20, the onset of the introduction of the HF vapor may occur at various times during the device fabrication. For example, in some embodiments of device fabrication method 20, the HF vapor may be introduced before any thermal processing is initiated in order to effectively etch the oxide layer from Group IV semiconductor nanoparticles in a porous compact 17, while in other embodiments the HF vapor may be introduced in the interval of the conditioning portion of the ramp. In still other embodiments, HF vapor may be introduced in the thermal processing step after densification has progressed. As one of ordinary skill in the art is apprised, other embodiments of process profile 24 are possible by varying the time of introduction of the HF vapor, the total time of exposure of the thin films to the vapor, the temperature of the processing profile that overlaps the HF exposure, and partial pressure of the HF vapor in the processing gas.

Another embodiment for the removal of an oxide layer from Group IV semiconductor nanoparticles is shown in process profile 21, depicted in FIG. 3B. In this exemplary embodiment, after a conditioning step $t_1$, as discussed above, except process profile is done in vacuo at between about $1\times10^{-7}$ to about $1\times10^{-4}$ Torr. At $t_2$, the temperature is ramped to between about 300° C. to about 1350° C. for a short duration of between about 0.1 minutes to about 10 minutes, or to process time $t_3$. In the interval of time between $t_2$-$t_3$, the oxide layer decomposes. For example, in the case of silicon, it is believed to be removed as $SiO_{(g)}$. During this high temperature interval, the process of thermal processing of a porous compact 18 to a thin film 19 is initiated, and is completed during a lower temperature interval between $t_4$-$t_5$ of longer duration than the high temperature step. This interval may be at between about 300° C. to about 800° C. for up to about 30 minutes. For either process 20 of FIG. 3A or process 21 of FIG. 3B, at the end of the process profile, after Group IV semiconductor thin film 19 has been formed, the thin film may be removed from the inert processing environment, as indicated in process step 150 of FIG. 1.

Figure 4B:
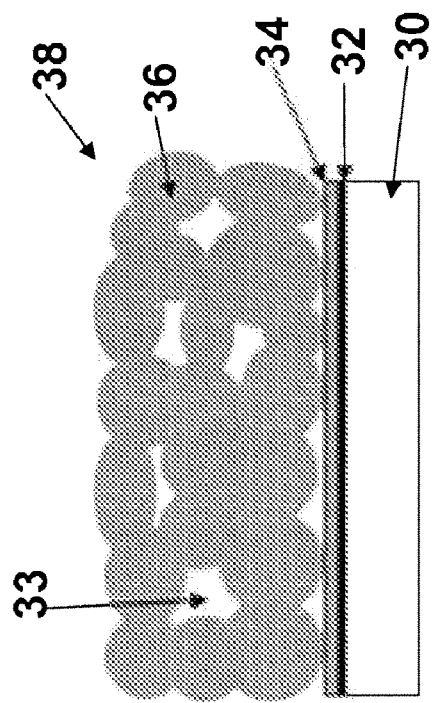
FIGS. 4A-4C depict a Group IV semiconductor porous compact (FIG. 4A) and a Group IV semiconductor thin film (FIG. 4B) having interstitial spaces and the thin film after in situ treatment (FIG. 4C) to fill the interstitial spaces, in accordance with the invention.
Figure 4A:
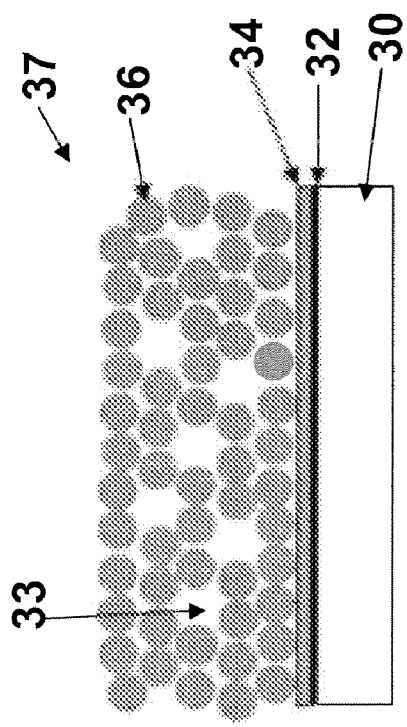
Figure 4C:
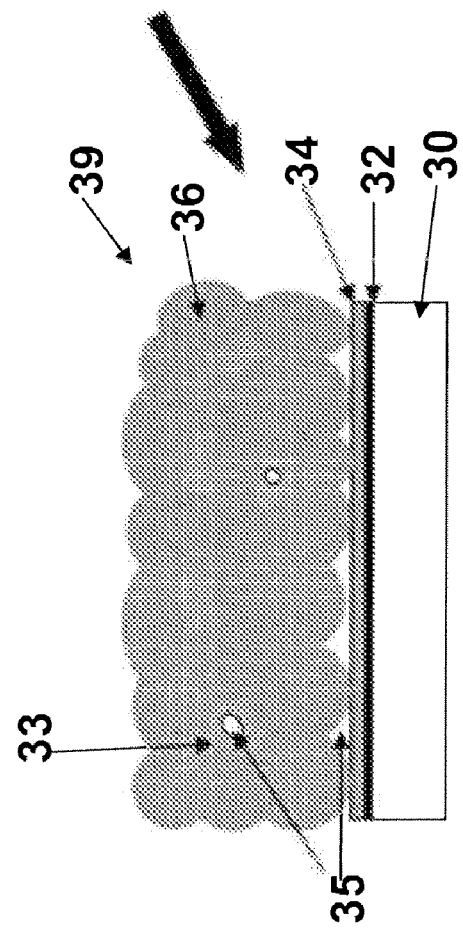

Cross-sections of renderings of a porous compact 37 and embodiments of thin films 38, 39 having interstitial spaces 33 are shown in FIGS. 4A-4C, which arc renderings shown for the purpose of highlighting concepts, and are not meant as actual representations of the thin film morphologies of embodiments of Group IV semiconductor thin films disclosed herein. The considerations for the substrate 30, the first electrode 34, and the insulating layer 32 are the same as previously described for the substrate 10, the first electrode 14, and the insulating layer 12 of FIGS. 2A-2C. In such an embodiment of a thin film 38, the interstitial spaces 33 remain in fluid communication with the external environment. As can be seen by inspection of thin film 38, the fabrication process has produced a film in which there is continuous, isotropic electrical communication within thin film 38. It is contemplated that a variety of fluids may be used to fill the interstitial spaces 33 with an insulating material using in situ treatment during thin film fabrication. The insulating material becomes a solid which fills or essentially fills the interstitial spaces under the targeted fabrication conditions for thin film 38. When the interstitial spaces 33 are filled or essentially filled with an insulating material, a continuous thin film 39 is formed, which will be a stable semiconductor thin film once transferred from an inert environment, as shown in process step 150 of FIG. 1.

Figure 5:
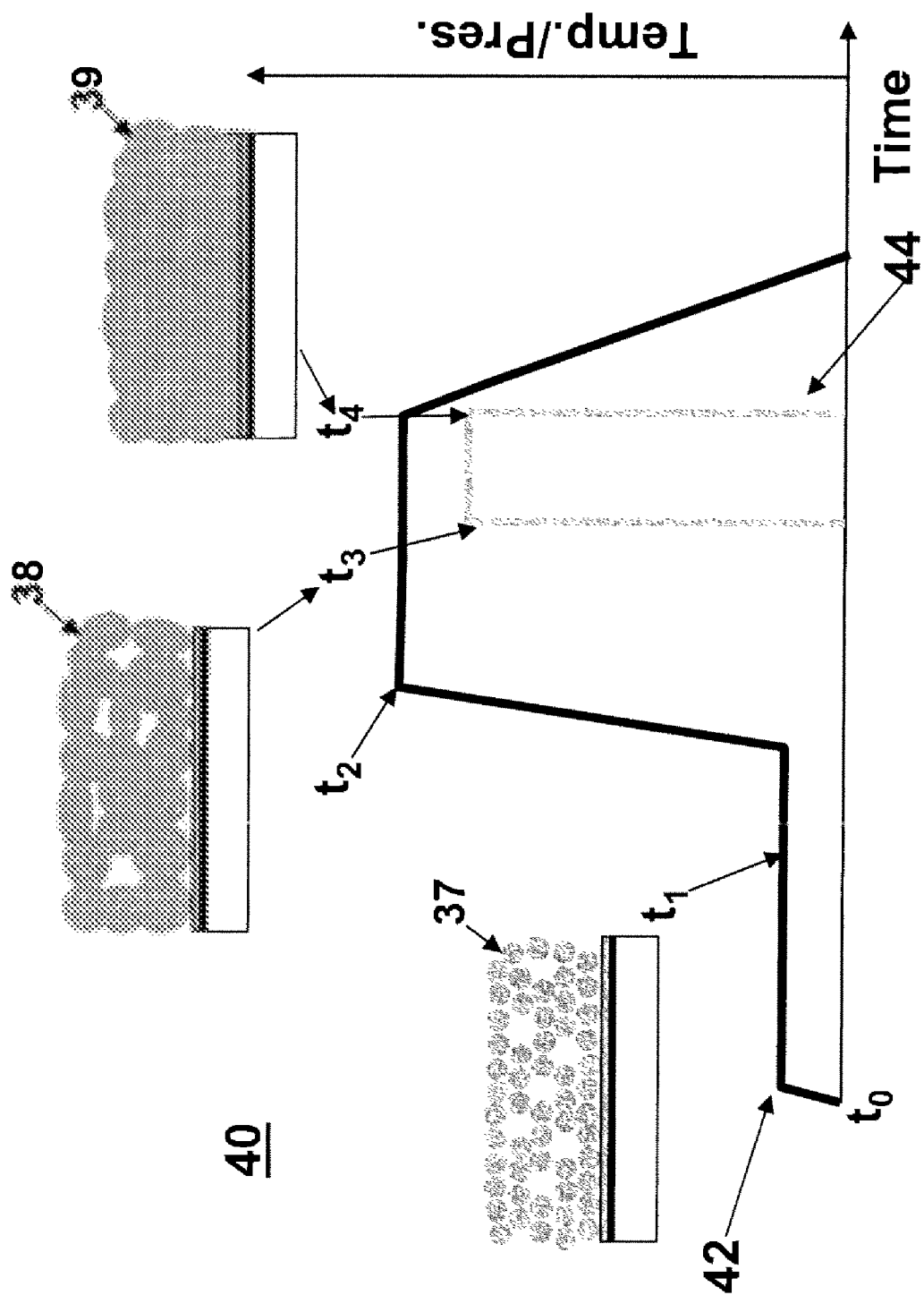
FIG. 5 shows an embodiment of an in situ process for filling the interstitial spaces of a Group IV semiconductor thin film, in accordance with the invention.

In FIG. 5, an embodiment of thin film fabrication process 40 is shown in which in situ treatment of thin film 38 is done. In the exemplary embodiment of thin film fabrication method 40 of FIG. 5, an embodiment of a thermal ramp profile 42, and an embodiment of the profile for introduction of a fluid 44 are indicated. At the initial time, $t_0$, porous compact 37 having interstitial spaces 33 is deposited on substrate 30, and is ready for fabrication. In the second process step, at time interval including $t_1$, the sample is conditioned before the thermal processing of the porous compact to fabricate a photoconductive thin film 38. Such a conditioning step may be useful for driving off volatile chemical species, such as solvent, as well as assisting in making the porous compact 37 more mechanically stable. Such a step may be done for about 1 minutes to about one hour, and between the temperatures of about 30° C. to about 300° C. in an inert environment, for example, such as in the presence of an inert gas, or in vacuo. After the conditioning step, the temperature is ramped at $t_2$ to the targeted fabrication temperature of between 100° C. to about 1000° C. In the exemplary embodiment shown in FIG. 5, after the fabrication of thin film 38 has been initiated, as shown at $t_3$, the introduction of a fluid is done, as indicated by process profile 44.

It is contemplated that a variety of fluids may be suitable for use for the purpose of the in situ filling or essential filling of interstitial spaces 33 with insulating material, such depicted in FIG. 4C. In some embodiments, the fluids are selected from gases, while in other embodiments, the fluids are selected from liquids that may be readily applied, and readily wet the Group IV semiconductor nanoparticles or thin film, and hence penetrate into either the interstitial spaces of a Group IV semiconductor porous compact or thin film. Depending on the process parameters, some embodiments of a Group IV semiconductor thin film 39 may be produced in which the interstitial spaces 33 are filled, such as the interstitial spaces in FIG. 4C with shading. In other embodiments of a Group IV semiconductor thin film 39, voids 35 may exist after in suit filling of the interstitial spaces with an insulating material, but are no longer in fluid communication with the external environment.

With respect to fluids selected from gases, insulating materials such as nitrides, oxides, and carbides of Group IV semiconductor materials may be deposited using chemical vapor deposition (CVD) techniques. For example, nitride materials can be deposited from gas compositions of ammonia with a Group IV semiconductor precursor gas, such as silane, disilane, germane, digermane, any of their halide analogs, and combinations thereof. Currently, there are numerous plasma enhanced CVD (PECVD) processes for the deposition of silicon nitride at reasonably low temperatures (e.g. ca. 200° C.). The PECVD deposition of nitrides of Group IV semiconductor materials are useful for filling or essentially filling interstitial spaces 33 shown in FIG. 4B with insulating material, as shown in FIG. 4C. The desired characteristic of the gas composition is that it must be readily decomposed into a nitride of Group IV materials within the targeted temperature range for fabrication; or between about 100° C. to about 1000° C., as previously mentioned. It should be noted that the gas composition is typically mixed with an inert gas, for example, such as nitrogen, and noble gases for example, such as argon and helium, and combinations thereof. In PECVD processes, many variable may impact the silicon nitride deposition, including, for example, partial pressures of Group IV semiconductor gas, ammonia, and inert gases, the substrate temperature, and the density of reactive species in the plasma (see for example, "Plasma Enhanced Chemical Vapor Deposition of SiN-Films for Passivation of Three-Dimensional Substrates", Orfert, M., and Richter, K.; *Surface and Coatings Technology*, 116-119 (1999) 622-628). Related CVD processes are known for the deposition of oxides and carbides of Group IV semiconductor materials.

As indicated for an exemplary embodiment of thin film fabrication method 40, the time for introducing the gas composition may be done during the time interval of the thin film fabrication, as indicated at time $t_3$ in the fabrication time interval $t_2$-$t_4$, as shown in FIG. 5. In alternative embodiments of thin film fabrication method 40, the onset of the introduction of the gas composition may occur at various times during the device fabrication. For example, in some embodiments of device fabrication method 40, the precursor gas may be introduced before thermal processing is initiated in order to fill the interstitial spaces of the porous compact, while in other embodiments the precursor gas may be introduced in the interval of the conditioning portion of the ramp. In other embodiments, the gas composition may be introduced during the ramp towards the fabrication temperature, which is a temperature below the targeted thermal processing temperature, but above the temperature at which the precursor gas will decompose. In still other embodiments of thin film fabrication method 40, the introduction of the precursor gas may occur after the fabrication of the thin film 38 has been completed. Finally, when the interstitial spaces are filled or essentially filled, the conditions may be chosen so that optionally, a capping layer (not shown) of nitrides, oxides, or carbides of Group IV semiconductor material are formed on top of the fabricated Group IV semiconductor thin film 39. The thickness of layer such a layer may be up to about 500 nm.

In still other embodiments of fluids used to fill interstitial spaces 33 of embodiments of porous thin films, such 38, as shown in FIG. 4B, solutions of insulators may be used to fill interstitial spaces 33. For example, there are many types of spin-on-glass (SOG) materials that have excellent properties for filling narrow, high aspect ratio spaces without creating voids, and have dielectric constants of between about 3 to about 4. Such SOG materials are typically solutions of siloxane materials, and may be readily applied to a fabricated film, such as Group IV semiconductor thin film 38 of FIG. 4B.

Solutions of SOGs are applied using spin coating at about 3000 to about 4000 rpm, followed by a bake step of between about 80° C. to about 250° C. for between about 1 minute to about 30 minutes. After the bake step, a cure step is done at between about 400° C. to about 600° C. for between about 30 minutes to about 1 hour. The resultant film is a thin film, such as thin film 39 of FIG. 4C, where the interstitial spaces 33 are filled or essentially filled.

For many embodiments of thin film 39 of FIG. 4C, a residual layer of insulating material may be also be deposited as either a continuous or partial layer on the top of the thin film, as previously discussed. Where multiple Group IV semiconductor layers are required to fabricate a device, such a residual layer of an insulating material would need to be removed. As one of ordinary skill in the art is aware, insulating materials may be removed from Group IV semiconductor films using processes with end point detection, such as chemical mechanical polishing (CMP), reactive ion etching, and reverse sputtering.

In FIG. 6A and FIG. 6B, another embodiment of an in situ treatment of a Group IV semiconductor thin film is depicted. A section of a thin film 39, such as shown in FIG. 4B, is shown in FIG. 6A and FIG. 6B. In the section shown of thin film 39, an expanded depiction of the thin film surface 40, is shown. What is depicted in expanded view 40 is that on the surface of a hydrogen-terminated Group IV semiconductor thin film, there are sites that are not hydrogenated 41, which are referred to as dangling bonds. Such dangling bonds are reactive, and implicated in the degradation of Group IV semiconductor thin films. Dangling bonds may originate from exposure of a hydrogen-terminated Group IV semiconductor materials to degradative conditions, for example, to high temperatures, e.g. above about 300° C. In FIG. 6B, the alkylation of the thin film surface is shown, to produce a passivated thin film surface 42. It has been observed that if Group IV semiconductor materials are passivated, as with a side variety of organic moieties, that degradation of such materials is either slowed or halted. Such an in situ passivation treatment of a Group IV semiconductor thin film could be done while the thin film is still in an inert environment as a part of fabrication step 140 of FIG. 1. The passivation of a surface of a Group IV semiconductor thin film while in an inert environment would stabilize the thin film from degradation, once exposed to normal environmental conditions, as in step 150 of FIG. 1.

Figure 7:
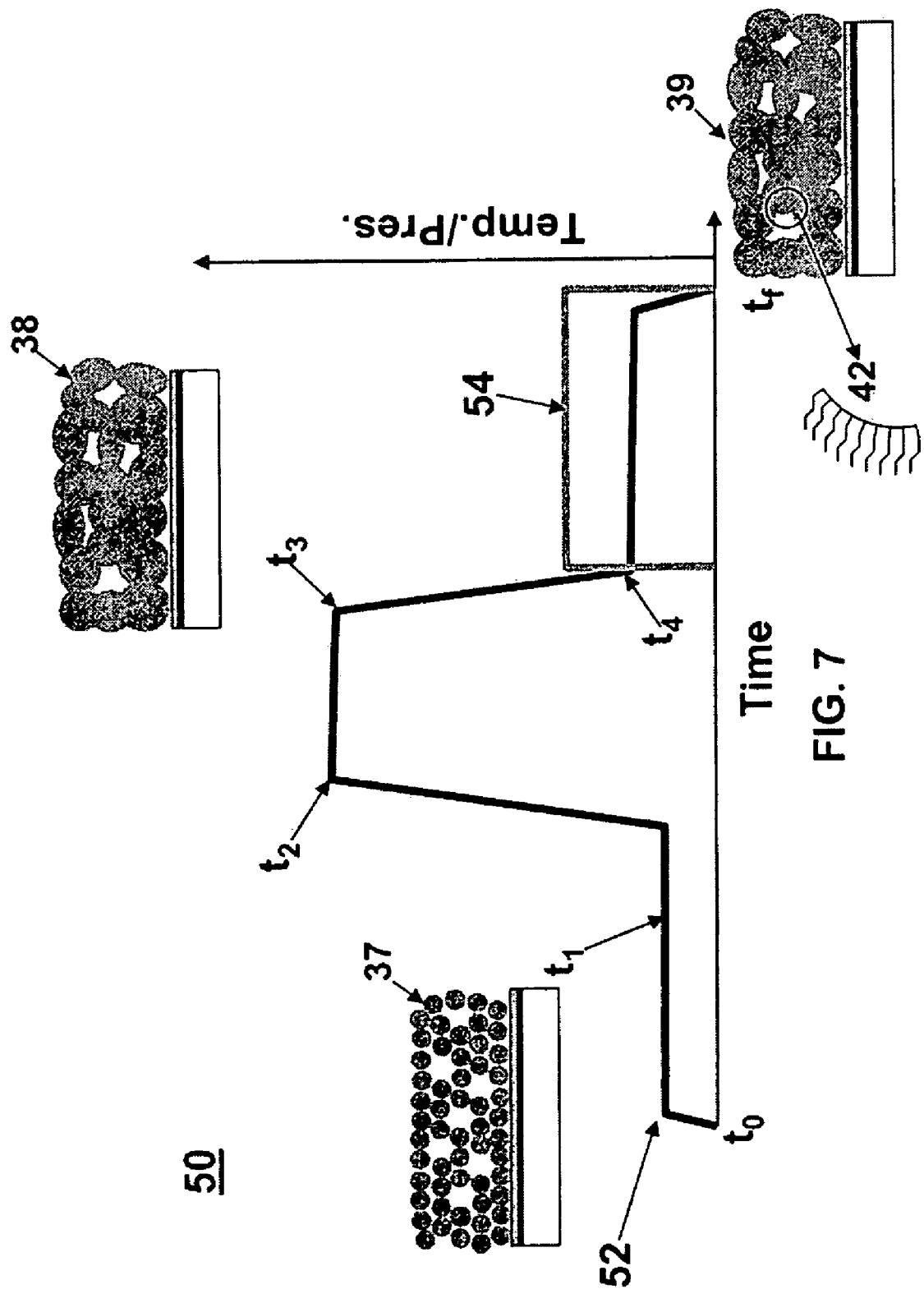

It is contemplated that such an in situ passivation of a thin film could be done using a fabrication process such as shown in FIG. 7, in which a thin film surface, such as thin film surface 40 of FIG. 6A could be treated to create an alkylated surface group 42 of FIG. 6B. For example, reactions considered for passivation of a surface such as thin film surface 40 of FIG. 6A may be done with chemical species selected from a series low molecular weight organic hydrocarbon species, for example, of between about C2 to about C6, having a terminal alkene or alkyne group that can undergo a hydrosilylation. Hydrosilylation is a reaction of an unsaturated group of an organic moiety with a surface Group IV semiconductor group to create an alkylated surface species, such an alkylated surface group 42 of FIG. 6B. The considerations for choosing a candidate hydrocarbon species include, but are not limited by, capable of providing high surface area coverage, and readily vaporized at the targeted reaction temperatures and pressures. In some embodiments, where capping a dangling bond is desirable, the reaction conditions may be at about room temperature and at about atmospheric pressure. In other embodiments, where passivation of a potentially chemically reactive surface is desirable, the reaction temperature may be at between 150° C. to 300° C., while the pressure may be between about 1 Torr to about atmospheric pressure. Examples of such hydrocarbon species include, by are not limited by, ethylene, acetylene, butene, and hexyne.

FIG. 7 is an embodiment of a thin film fabrication process 50, which is exemplary of a thin film fabrication process incorporating in situ passivation of a thin film surface. The steps for the fabrication of thin film 38 are like those described for thin film process 40 of FIG. 5. For thin film fabrication process 50, after the formation of thin film 38, an in situ passivation process step 54 is initiated at $t_4$. As previously mentioned, a desired characteristic of embodiments of useful hydrocarbon species is that they be in the gas phase within in a temperature range of between about 25° C. to about 300° C. Within this range, embodiments of the hydrosilylation reaction using an organic hydrocarbon having a terminal alkene or alkyne group to passivate the surface of a Group IV semiconductor material can be optimized. It should be noted that the hydrocarbon species may be mixed with an inert gas, for example, such as nitrogen and hydrogen, and noble gases for example, such as argon and helium. In various embodiments of methods for the in situ passivation of Group IV thin films, the inert gas may be up to about 99% in composition with the hydrocarbon species, and may be maintained at between about 1 Torr to about one atmosphere and held at between about 25° C. to about 300° C. for between about 10 minutes of time to 10 hours. In addition to resistive heat, the hydrocarbon gases may also be volatilized using sources such as lamps, for example, tungsten-halogen lamps and continuous arc lamps, lasers operating in the wavelength range between about 0.3 micron to about 10 micron, and microwave processing equipment. In that regard, the process of passivation of a the surface of a Group IV semiconductor thin film is compatible with the previously discussed methods used for fabricating photoconductive thin films from films of deposited Group IV semiconductor nanoparticles. After the completion of the passivation process step 54, the thin film may be removed from an inert environment, as indicated in step 150 of FIG. 1.

While principles of the disclosed in situ treatments during the fabrication of Group IV semiconductor thin films have been described in connection with specific embodiments of thin films and methods, it should be understood clearly that these descriptions are made only by way of example and are not intended to limit the scope of what is disclosed. In that regard, what has been disclosed herein has been provided for the purposes of illustration and description. It is not intended to be exhaustive or to limit what is disclosed to the precise forms described. Many modifications and variations will be apparent to the practitioner skilled in the art. What is disclosed was chosen and described in order to best explain the principles and practical application of the disclosed embodiments of the art described, thereby enabling others skilled in the art to understand the various embodiments and various modifications that are suited to the particular use contemplated. It is intended that the scope of what is disclosed be defined by the following claims and their equivalence.

What is claimed is:

1. A method of forming a densified nanoparticle thin film in a chamber, comprising:

positioning a substrate in the chamber;

depositing a nanoparticle ink, the nanoparticle ink including a set of Group IV semiconductor particles and a solvent;

heating the nanoparticle ink to a first temperature between about 30° C. and about 300° C., and for a first time period between about 1 minute and about 60 minutes, wherein the solvent is substantially removed, and a porous compact is formed;

exposing the porous compact to an HF vapor for a second time period of between about 2 minutes and about 20 minutes, and heating the porous compact for a second temperature of between about 25° C. and about 60° C.; and heating the porous compact to a third temperature between about 100° C. and about 1000° C., and for a third time period of between about 5 minutes and about 10 hours;

wherein the densified nanoparticle thin film is formed.

2. The method of claim 1, wherein the set of Group IV semiconductor particle is one of n-doped semiconductor particles, p-doped semiconductor particle, and intrinsic semiconductor particles.

3. The method of claim 1, wherein the substrate is one of silicon, quartz, soda lime, and borosilicate glasses.

4. The method of claim 1, wherein the HF vapor is generated from one of an aqueous solution of HF or an anhydrous HF.

5. The method of claim 1, wherein the substrate is one of stainless steel and a heat durable polymer.

6. The method of claim 1, further including the step of depositing on the porous compact a spin-on-glass material, after the step of heating the porous compact to a third temperature.

7. The method of claim 1, further including the step of depositing on the porous compact a low molecular weight organic hydrocarbon species between about C2 and about C6, after the step of heating the porous compact to a third temperature.

8. A method of forming a densified nanoparticle thin film, comprising:

positioning a substrate in a first chamber;

depositing a nanoparticle ink, the nanoparticle ink including a set of Group IV semiconductor particles and a solvent;

positioning the substrate in a second chamber, the second chamber having a pressure of between about $1\times10^{-7}$ Torr and about $1\times10^{-4}$;

heating the nanoparticle ink to a first temperature between about 30° C. and about 300° C., and for a first time period between about 1 minute and about 60 minutes, wherein the solvent is substantially removed, and a porous compact is formed;

exposing the porous compact to an HF vapor for a second time period of between about 0.1 minutes and about 10 minutes, and heating the porous compact for a second temperature of between about 300° C. and about 1350° C.;

heating the porous compact to a third temperature between about 300° C. and about 800° C., and for a third time period of about 30 minutes;

wherein the densified nanoparticle thin film is formed.

9. The method of claim 8, wherein the set of Group IV semiconductor particles is one of n-doped semiconductor particles, p-doped semiconductor particles, and intrinsic semiconductor particles.

10. The method of claim 8, wherein the substrate is one of silicon, quartz, soda lime, and borosilicate glasses.

11. The method of claim 8, wherein the HF vapor is generated from one of an aqueous solution of HF or an anhydrous HF.

12. The method of claim 8, wherein the substrate is one of stainless steel and a heat durable polymer.

13. The method of claim 8, further including the step of depositing on the porous compact a spin-on-glass material, after the step of heating the porous compact to a third temperature.

14. The method of claim 8, further including the step of depositing on the porous compact a low molecular weight organic hydrocarbon species between about C2 and about C6, after the step of heating the porous compact to a third temperature.

15. A method of forming a densified nanoparticle thin film, comprising:

positioning a substrate in a first chamber;

depositing a nanoparticle ink, the nanoparticle ink including a set of Group IV semiconductor particles and a solvent;

heating the nanoparticle ink to a first temperature between about 30° C. and about 300° C., and for a first time period between about 1 minute and about 60 minutes, wherein the solvent is substantially removed, and a porous compact is formed;

positioning the substrate in a second chamber, the second chamber having a pressure of between about $1\times10^{-7}$ Torr and about $1\times10^{-4}$;

exposing the porous compact to an HF vapor for a second time period of between about 0.1 minutes and about 10 minutes, and heating the porous compact for a second temperature of between about 300° C. and about 1350° C.;

heating the porous compact to a third temperature between about 300° C. and about 800° C., and for a third time period of about 30 minutes;

wherein the densified nanoparticle thin film is formed.

16. The method of claim 15, wherein the set of Group IV semiconductor particles is one of n-doped semiconductor particles, p-doped semiconductor particles, and intrinsic semiconductor particles.

17. The method of claim 15, wherein the substrate is one of silicon, quartz, soda lime, and borosilicate glasses.

18. The method of claim 15, wherein the HF vapor is generated from one of an aqueous solution of HF or an anhydrous HF.

19. The method of claim 15, wherein the substrate is one of stainless steel and a heat durable polymer.

20. The method of claim 15, further including the step of depositing a spin-on-glass material, after the step of heating the porous compact to a third temperature.

21. The method of claim 15, further including the step of depositing a low molecular weight organic hydrocarbon species between about C2 and about C6, after the step of heating the porous compact to a third temperature.

* * * * *